US009834700B2

(12) United States Patent
Ellison et al.

(10) Patent No.: US 9,834,700 B2
(45) Date of Patent: Dec. 5, 2017

(54) POLYLACTIDE/SILICON-CONTAINING BLOCK COPOLYMERS FOR NANOLITHOGRAPHY

(71) Applicant: Board of Regents, The University of Texas System, Austin, TX (US)

(72) Inventors: Christopher J. Ellison, Austin, TX (US); Carlton Grant Willson, Austin, TX (US); Julia Cushen, Austin, TX (US); Christopher M. Bates, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 14/827,876

(22) Filed: Aug. 17, 2015

(65) Prior Publication Data

US 2015/0353763 A1 Dec. 10, 2015

Related U.S. Application Data

(63) Continuation of application No. 13/761,763, filed on Feb. 7, 2013, now Pat. No. 9,120,117.

(60) Provisional application No. 61/597,329, filed on Feb. 10, 2012.

(51) Int. Cl.

| | |
|---|---|
| *C09D 167/00* | (2006.01) |
| *B05D 1/00* | (2006.01) |
| *B05D 3/00* | (2006.01) |
| *B05D 5/00* | (2006.01) |
| *C08G 63/695* | (2006.01) |
| *B05C 21/00* | (2006.01) |
| *C08F 112/14* | (2006.01) |
| *G03F 7/00* | (2006.01) |
| *B82Y 10/00* | (2011.01) |
| *B82Y 40/00* | (2011.01) |
| *C08F 8/02* | (2006.01) |

(52) U.S. Cl.
CPC .......... *C09D 167/00* (2013.01); *B05C 21/005* (2013.01); *B05D 1/005* (2013.01); *B05D 3/00* (2013.01); *B05D 5/00* (2013.01); *B82Y 10/00* (2013.01); *B82Y 40/00* (2013.01); *C08F 8/02* (2013.01); *C08F 112/14* (2013.01); *C08G 63/6952* (2013.01); *G03F 7/0002* (2013.01); *C08F 2810/40* (2013.01); *Y10T 428/24851* (2015.01); *Y10T 428/31504* (2015.04)

(58) Field of Classification Search
CPC ..... C09D 167/00; C08G 63/6952; C08F 8/02; C08F 112/14; C08F 2810/40; B05D 1/005; B05D 3/00; B05D 5/00; B05C 21/005; G03F 7/0002; B82Y 10/00; B82Y 40/00; Y10T 428/31504; Y10T 428/24851

USPC .......................................... 524/588; 427/272
See application file for complete search history.

(56) References Cited

U.S. PATENT DOCUMENTS

| | | | |
|---|---|---|---|
| 8,101,261 B2 | 1/2012 | Millward et al. | ............. 428/105 |
| 2009/0239086 A1* | 9/2009 | Ishizuka | ................ B05D 1/185 |
| | | | 428/447 |
| 2009/0305173 A1 | 12/2009 | Xiao et al. | ..................... 430/324 |

FOREIGN PATENT DOCUMENTS

WO WO/2011/116223 9/2011

OTHER PUBLICATIONS

Bates, C. M. et al. (2012) "Polarity-Switching Top Coats Enable Orientation of Sub-10-nm Block Copolymer Domains," *Science* 338(6108), 775-779.
Bates, C. M. et al. (2011) "Polymeric Cross-Linked Surface Treatments for Controlling Block Copolymer Orientation in Thin Films," *Langmuir* 27(5), 2000-2006.
Bates, F. S. et al. (1990) "Block Copolymer Thermodynamics: Theory and Experiment," *Annual Review of Physical Chemistry* 41, 525-557.
Bates, F. S. et al. (1999) "Block Copolymers—Designer Soft Materials," *Physics Today* 52(2), 32-38.
Colburn, M. et al. (2000) "Step and flash imprint lithography for sub-100-nm patterning," *Proceedings of SPIE—The International Society for Optical Engineering* 3997, 453-457.
Cushen, J. D. et al. (2012) "Thin Film Self-Assembly of Poly(trimethylsilylstyrene-b-d,l-lactide) with Sub-10 nm Domains," *Macromolecules* 45(21), 8722-8728.
Gillham, J. K. (1986) "Formation and Properties of Thermosetting and High $T_g$ Polymeric Materials," *Polymer Engineering and Science* 26(20), 1429-1433.
Han, E. et al. (2009) "Perpendicular Orientation of Domains in Cylinder-Forming Block Copolymer Thick Films by Controlled Interfacial Interactions," *Macromolecules* 42(13), 4896-4901.
Ho, C.-H. et al. (2009) "Synthesis and characterization of (AB)n-type poly(l-lactide)-poly(dimethyl siloxane) multiblock copolymer and the effect of its macrodiol composition on urethane formation," *European Polymer Journal* 45(8), 2455-2466.
Jung, Y. S. et al. (2007) "Orientation-Controlled Self-Assembled Nanolithography Using a Polystyrene-Polydimethylsiloxane Block Copolymer," *Nano Letters* 7(7), 2046-2050.

(Continued)

*Primary Examiner* — William Phillip Fletcher, III
(74) *Attorney, Agent, or Firm* — Medlen & Carroll, LLP

(57) ABSTRACT

The present invention includes a diblock copolymer system that self-assembles at very low molecular weights to form very small features. In one embodiment, one polymer in the block copolymer contains silicon, and the other polymer is a polylactide. In one embodiment, the block copolymer is synthesized by a combination of anionic and ring opening polymerization reactions. In one embodiment, the purpose of this block copolymer is to form nanoporous materials that can be used as etch masks in lithographic patterning.

22 Claims, 9 Drawing Sheets

(56) References Cited

OTHER PUBLICATIONS

Kim, H.-C. et al. (2001) "A Route to Nanoscopic SiO$_2$ Posts via Block Copolymer Templates," *Advanced Materials* 13(11), 795-797.

Kim, H.-C. et al. (2009) "Block Copolymer Based Nanostructures: Materials, Processes, and Applications to Electronics," *Chemical Reviews* 110(1), 146-177.

Ku, S. J. et al. (2011) "Nanoporous hard etch masks using silicon-containing block copolymer thin films," *Polymer* 52(1), 86-90.

Lammertink, R. G. H. et al. (2000) "Nanostructured Thin Films of Organic-Organometallic Block Copolymers: One-Step Lithography with Poly(ferrocenylsilanes) by Reactive Ion Etching," *Advanced Materials* 12(2), 98-103.

Li, M. et al. (2006) "Block copolymer patterns and templates," *Materials Today* 9(9), 30-39.

Milner, S. T. (1991) "Polymer brushes," *Science* 251(4996), 905-914.

Nagarajan, S. et al. (2008) "An Efficient Route to Mesoporous Silica Films with Perpendicular Nanochannels," *Advanced Materials* 20(2), 246-251.

Park, M. et al. (1997) "Block Copolymer Lithography: Periodic Arrays of ~1011 Holes in 1 Square Centimeter," *Science* 276(5317), 1401-1404.

Ross, C. A. (2001) "Patterned Magnetic Recording Media," *Annual Review of Materials Research* 31(1), 203-238.

Ruiz, R. et al. (2008) "Density Multiplication and Improved Lithography by Directed Block Copolymer Assembly," *Science* 321(5891), 936-939.

Ryu, D. Y. et al. (2007) "Surface Modification with Cross-Linked Random Copolymers: Minimum Effective Thickness," *Macromolecules* 40(12), 4296-4300.

Vayer, M. et al. (2010) "Perpendicular orientation of cylindrical domains upon solvent annealing thin films of polystyrene-b-polylactide," *Thin Solid Films* 518(14), 3710-3715.

Walton, D. G. et al. (1994) "A Free Energy Model for Confined Diblock Copolymers," *Macromolecules* 27(21), 6225-6228.

Wang, Y. et al. (2000) "Synthesis of Polybutadiene-Polylactide Diblock Copolymers Using Aluminum Alkoxide Macroinitiators. Kinetics and Mechanism," *Macromolecules* 33(20), 7395-7403.

Yang, X. et al. (2008) "Toward 1 Tdot/in.$^2$ nanoimprint lithography for magnetic bit-patterned media: Opportunities and challenges," *Journal of Vacuum Science & Technology B: Microelectronics and Nanometer Structures* 26(6), 2604-2610.

Zalusky, A. S. et al. (2002) "Ordered Nanoporous Polymers from Polystyrene-Polylactide Block Copolymers," *Journal of the American Chemical Society* 124(43), 12761-12773.

Zhao, B. et al. (2000) "Polymer brushes: surface-immobilized macromolecules," *Progress in Polymer Science* 25(5), 677-710.

PCT International Search Report of International Application No. PCT/US2013/025160 dated Jul. 20, 2013.

\* cited by examiner

| Sample | $M_n$ PTMSSOH | PDI PTMSSOH | $M_n$ PLA | PDI PTMSS-PLA | Vol. % PLA | Morphology (SAXS) | d (nm) |
|---|---|---|---|---|---|---|---|
| PTMSS$_6$-b-PLA$_{4.1}$ | 6000 | 1.13 | 4100 | 1.09 | 36.1 | Cylindrical | 12.1 |
| PTMSS$_6$-b-PLA$_{7.1}$ | 6000 | 1.13 | 7100 | 1.07 | 49.5 | Lamellar | 15.3 |

POLYLACTIDE/SILICON-CONTAINING BLOCK COPOLYMERS FOR NANOLITHOGRAPHY

This application claims the benefit of priority to Provisional Application U.S. Ser. No. 61/597,329, which was filed on Feb. 10, 2012, the disclosures of which are incorporated herein by reference.

FIELD OF THE INVENTION

The present invention includes a diblock copolymer system that self-assembles at very low molecular weights to form very small features. In one embodiment, one polymer in the block copolymer contains silicon, and the other polymer is a polylactide. In one embodiment, the block copolymer is synthesized by a combination of anionic and ring opening polymerization reactions. In one embodiment, the purpose of this block copolymer is to form nanoporous materials that can be used as etch masks in lithographic patterning.

BACKGROUND OF THE INVENTION

The improvement in areal density in hard disk drives using conventional multigrain media is currently bound by the superparamagnetic limit [1]. Bit patterned media can circumvent this limitation by creating isolated magnetic islands separated by a nonmagnetic material. Nanoimprint lithography is an attractive solution for producing bit patterned media if a template can be created with sub-25 nm features [2]. Resolution limits in optical lithography and the prohibitive cost of electron beam lithography due to slow throughput [3] necessitate a new template patterning process. The self-assembly of diblock copolymers into well-defined structures [4] on the order of 5-100 nm produces features on the length scale required for production of bit patterned media. This is most efficiently accomplished by using block copolymers to produce templates for imprint lithography [5]. With the availability of the proper template, imprint lithography can be employed to produce bit-patterned media efficiently. Previous research has targeted block copolymers that produce hexagonally packed cylindrical morphology with selective silicon incorporation into one block for etch resistance [6] through post-polymerization $SiO_2$ growth [7], silica deposition using supercritical $CO_2$ [8], and silicon-containing ferrocenyl monomers [9]. What is needed is a method to create an imprint template with sub-100 nm features with the desired structural alignment of nanostructures that can be etched with the good oxygen etch contrast that silicon provides.

SUMMARY OF THE INVENTION

The present invention includes a diblock copolymer system that self-assembles at very low molecular weights to form very small features. In one embodiment, one polymer in the block copolymer contains silicon, and the other polymer is polylactide. In one embodiment, the block copolymer is synthesized by a combination of anionic and ring opening polymerization reactions. In one embodiment, the purpose of this block copolymer is to form nanoporous materials that can be used as etch masks in lithographic patterning.

The present invention contemplates silicon and lactide-containing compositions, methods of synthesis, and methods of use. More specifically, the present invention relates, in one embodiment, to a block copolymer derived from two (or more) monomeric species, at least one of which comprising silicon and at least one of which incorporates a lactide. Such compounds have many uses including multiple applications in the semiconductor industry including making templates for nanoimprint lithography and biomedical applications.

In one embodiment, the invention relates to a method of synthesizing a silicon and lactide-containing block copolymer, comprising: a) providing first and second monomers, said first monomer comprising a silicon atom and said second monomer being a lactide based monomer lacking silicon that can be polymerized; b) treating said second monomer under conditions such that reactive polymer of said second monomer is formed; c) reacting said first monomer with said reactive polymer of said second monomer under conditions such that said silicon-containing block copolymer is synthesized; and d) wherein the glass transitions of both blocks are above room temperature. In one embodiment, at least one of said blocks is cross-linkable. In one embodiment, a third monomer is provided and said block copolymer is a triblock copolymer. In one embodiment, said block copolymers form nanostructured materials that can be used as etch masks in lithographic patterning processes. In one embodiment, said block co-polymer comprised of at least one block of a lactide and at least one block of a silicon containing polymer or oligomer with at least 10 wt % silicon. In one embodiment, said block copolymer is endcapped. In one embodiment, said block copolymer is endcapped with a functional group. In one embodiment, said block copolymer is endcapped with a hydroxyl functionality by reacting with ethylene oxide. In one embodiment, the method further comprises e) precipitating said silicon-containing block copolymer in methanol. In one embodiment, one of the blocks is polytrimethylsilylstyrene. In one embodiment, said first monomer is trimethylsilylstyrene. In one embodiment, said first monomer is a silicon-containing methacrylate. In one embodiment, said first monomer is methacryloxymethyltrimethylsilane (MTMSMA). In one embodiment, the method further comprises the step f) coating a substrate with said block copolymer so as to create a block copolymer film. In one embodiment, said substrate comprises silicon. In one embodiment, said substrate is a silicon wafer. In one embodiment, said substrate is quartz. In one embodiment, said substrate is glass. In one embodiment, said substrate is plastic. In one embodiment, said plastic includes, but is not limited to polyethylene terephthalate (PET), Teflon (polytetrafluoroethylene or PTFE), etc. In one embodiment, said substrate is a transparent substrate. In one embodiment, said substrate is coated with a substrate surface energy neutralizing layer with surface energy in between that of two blocks In one embodiment, said substrate surface energy neutralizing layer is selected from the group consisting of: (a) high Tg polymer, (b) a cross-linked polymer, (c) vapor deposited polymer such as parylene, (d) small molecule derivatives of silylating agents, and (e) polymer brush by end-attaching polymer to substrate. In one embodiment, the method further comprises the step g) treating said film under conditions such that nanostructures form. In one embodiment, said treating comprises annealing. In one embodiment, said annealing is by exposure to solvent vapors. In one embodiment, said annealing is by heating. In one embodiment, said nanostructures are selected from the group consisting of: lamellae, cylinders, vertically aligned cylinders, horizontally aligned cylinders, spheres, gyroids, network structures, and hierarchical nanostructures. In one embodiment, said nanostructures comprise spherical structures. In one embodiment, said nanostructures comprise cylindrical structures, said cylindrical structures being substantially vertically aligned with respect to the plane of the surface. In one embodiment, said treating comprises exposing said coated surface to a saturated atmosphere of acetone, THF, cyclohexane, or other vaporizing agent or combinations thereof. In one embodiment, said surface is on a silicon wafer. In one embodiment, said surface is glass. In one embodiment, said surface is quartz. In one embodiment, said substrate is not pre-treated with a surface energy neutralizing layer prior to step f). In one embodiment, said substrate is pre-treated with a surface energy neutralizing layer prior to step f). In one embodiment, a third monomer is provided and said block copolymer is a triblock copolymer. In one embodiment, the invention relates to the film made according to the process of described above.

In one embodiment, the invention relates to a method of forming nanostructures on a surface, comprising: a) a. providing a silicon and lactide-containing block copolymer block copolymer and a surface; b) spin coating said block copolymer on said surface to create a coated surface; and c). treating said coated surface under conditions such that nanostructures are formed on said surface. In one embodiment, said nanostructures comprises cylindrical structures, said cylindrical structures being substantially vertically aligned with respect to the plane of the surface. In one embodiment, said treating comprises exposing said coated surface to a saturated atmosphere of acetone or THF. In one embodiment, said surface is on a silicon wafer. In one embodiment, said surface is glass. In one embodiment, said surface is quartz. In one embodiment, said surface is not pre-treated with a substrate neutralization layer prior to step b). In one embodiment, said surface is pre-treated with a cross-linked polymer prior to step b). In one embodiment, the invention relates to the film made according to the process of described above. In one embodiment, the invention further comprising the step d) etching said nanostructure-containing coated surface.

BRIEF DESCRIPTION OF THE DRAWINGS

For a more complete understanding of the features and advantages of the present invention, reference is now made to the detailed description of the invention along with the accompanying figures.

FIG. 10 shows properties of the polymers investigated.
Table 1 shows properties of the polymers investigated.

DEFINITIONS

Figure 1:
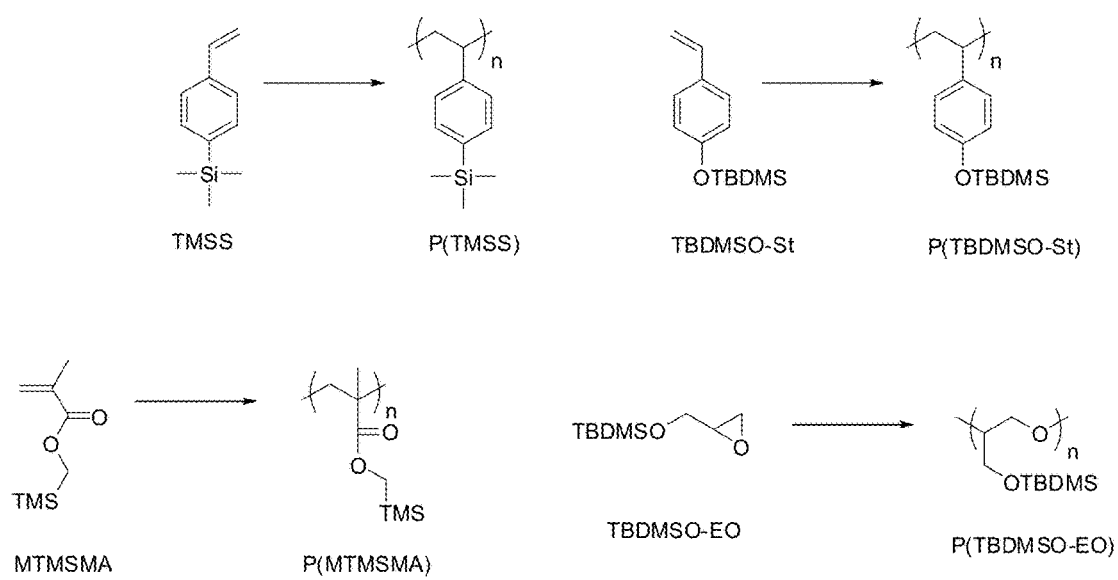
FIG. 1 shows non-limiting structures of illustrative silicon-containing monomers and polymers.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

In addition, atoms making up the compounds of the present invention are intended to include all isotopic forms of such atoms. Isotopes, as used herein, include those atoms having the same atomic number but different mass numbers. By way of general example and without limitation, isotopes of hydrogen include tritium and deuterium, and isotopes of carbon include $^{13}C$ and $^{14}C$. Similarly, it is contemplated that one or more carbon atom(s) of a compound of the present invention may be replaced by a silicon atom(s). Furthermore, it is contemplated that one or more oxygen atom(s) of a compound of the present invention may be replaced by a sulfur or selenium atom(s).

An important factor in determining whether a block copolymer will self assemble is the relative volume fraction of one of the blocks, the relative incompatibility of the monomer units, measured by the Flory-Huggins interaction parameter (Greek Symbol Chi χ), and the degree of polymerization of the block copolymer. Preferably, the volume fraction of one of the blocks is 30-70, 35-65, 40-60, more preferably 50-50 and the degree of polymerization (N) and Flory-Huggins interaction parameter of the block copolymer is preferably greater than 10.5 and is more preferably greater than 25.

The block copolymer or blend thereof can be cross-linked by any convenient method. In one embodiment the block copolymer or blend thereof is deposited as a film or coating and then cross-linked using UV light or ionizing radiation. If necessary, free radical initiators or prorads may be added to the block copolymer or blend thereof in order to assist the cross-linking reaction. Preferably, however, the block copolymer or blend thereof comprises a cross-linking agent, especially when the block copolymer or blend thereof is used in a film-forming or coating composition. Preferably, the cross-linking agent and concentration of cross-linking agent are chosen such that the rate constant of the cross-linking reaction is relatively slow, thereby giving a relatively long pot life for the film-forming or coating composition. This is particularly important when the film-forming composition or coating composition is to be used as a printing ink or deposited using ink jet printing technology. Preferably, the rate constant of the cross-linking reaction is such that the speed of cross-linking is slower than the speed of self-assembly of the block copolymer or blend thereof.

Poly(lactic acid) or polylactide (PLA) is a thermoplastic aliphatic polyester derived from renewable resources, such as corn starch, tapioca products (roots, chips or starch) or sugarcanes. Polylactide can be produced from plants and its strength and physical properties are relatively better than those of other biodegradable resins. Accordingly, polylactide has rapidly become a focus of attention as a material alternative to existing plastics or fibers that are made from petroleum.

However, the biodegradability of polylactide is lower than that of other commonly known biodegradable plastics such as polyhydroxybutyric acid, polycaprolactone, or polybutylene succinate. For example, the quantities of biodegradable plastic-degrading bacteria in these plastics can be represented by the following sequence: polyhydroxybutyric acid≥polycaprolactone>polybutylene succinate>polylactide. Unlike another commonly known biodegradable plastic, i.e., aliphatic polyester, polylactide is aliphatic polyester formed by an α-ester bond. Thus, polylactide has specific properties. For example, it is not degraded by a lipase, esterase, or polyhydroxybutyric acid-degrading enzyme.

The skeletal formula of poly(lactic acid):

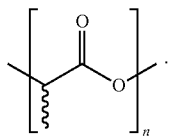

It is typically synthesized by the following reaction:

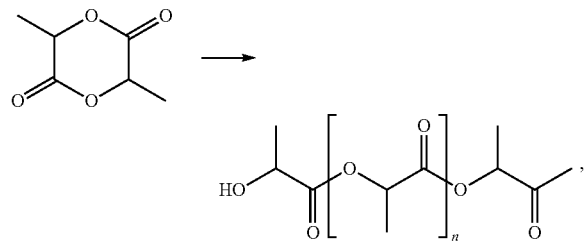

this uses 3,6-dimethyl-1,4-dioxane-2,5-dione, also known as DL-Lactide.

The polylactide used in the present invention is preferably poly-L-lactic acid, and poly-D-lactic acid may also be used. Alternatively, a mixture or copolymer of poly-L-lactic acid and poly-D-lactic acid may be used. Further, a copolymer, which incorporates therein a unit having biodegradability such as β-propiolactone, β-butyrolactone, pivalolactone, γ-butyrolactone, γ-methyl-γ-butyrolactone, γ-ethyl-γ-butyrolactone, glycolide, lactide, δ-valerolactone, β-methyl-α-valerolactone, ε-caprolactone, ethylene oxide, or propylene oxide, may be used. In addition, generally commercially available biodegradable resins such as polyhydroxybutyric acid, polybutylene succinate, a polybutylene succinate-adipate copolymer, polycaprolactone, or polyester carbonate may be suitably blended into polylactide for the purpose of improving the physical properties thereof.

As used herein, Glass transition temperature is represented by the abbreviation $T_g$. Vitrification occurs when the glass transition temperature, $T_g$, rises to the isothermal temperature of cure, as described in Gillham, J. K. (1986) [12].

As used herein, end capping functionalities refer to functional groups that are added onto the end of a polymer. Some non-limiting endcapping functionalities might include hydroxyl, amines, azide, alkyne, carboxylic acid, halides, etc.

As used herein, silylating agents (also known as silanes or self-assembled monolayers) refer to organosilicon compounds with methoxy, ethoxy, or halide functionalities. Some non-limiting examples include methyldichlorosilane, methyldiethoxysilane, allyl(chloro)dimethylsilane, and (3-amniopropyl) triethoxysilane.

As used herein, brush polymers are a class of polymers that are adhered to a solid surface [13]. The polymer that is adhered to the solid substrate must be dense enough so that there is crowding among the polymers which then, forces the polymers to stretch away from the surface to avoid overlapping. [14]

In the field of electronic devices, Roll-to-roll processing, also known as web processing, reel-to-reel processing or R2R, is the process of creating electronic devices on a roll of flexible plastic or metal foil. In other fields predating this use, it can refer to any process of applying coatings, printing, or performing other processes starting with a roll of a flexible material and re-reeling after the process to create an output roll. A thin-film solar cell (TFSC), also called a thin-film photovoltaic cell (TFPV), is a solar cell that is made by depositing one or more thin layers (thin film) of photovoltaic material on a substrate substrate or surface. Possible roll-to-roll substrates include, but are not limited to metalized polyethylene terphthalate, metal film (steel), glass films (e.g. Corning Gorilla Glass), graphene coated films, polyethylene naphthalate (Dupont Teonex), and Kapton film, polymer films, metalized polymer films, glass or silicon, carbonized polymer films, glass or silicon. Possible polymer films include polyethylene terephthalate, kapton, mylar, etc.

As used herein, a block copolymer consists of two or more polymeric chains (blocks), which are chemically different and covalently attached to each other. Block copolymers are being suggested for many applications based primarily on their ability to form nanometer scale patterns. These self-assembled patterns are being considered as nanolithographic masks as well as templates for the further synthesis of inorganic or organic structures. Such applications are made possible by taking advantage of contrasts in chemical or physical properties that lead to differential etch rates or attractions to new materials. New applications in, for example, fuel cells, batteries, data storage and optoelectronic devices generally rely on the inherent properties of the blocks. All of these uses depend on the regular self-assembly of block copolymers over macroscopic distances.

Trimethyl-(2-methylene-but-3-enyl)silane is represented by the following structure:

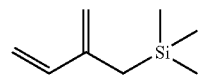

and abbreviated (TMSI) and whose polymeric version is

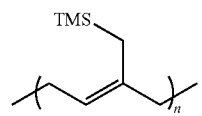

and is abbreviated P(TMSI).

Trimethyl(4-vinylphenyl)silane is another example of a styrene derivative and is represented by the following structure:

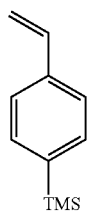

and abbreviated TMSS and whose polymeric version is

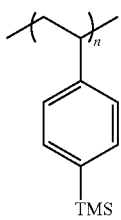

and is abbreviated P(TMSS).

Tert-butyldimethyl(4-vinylphenoxy)silane is another example of a styrene derivative and is represented by the following structure:

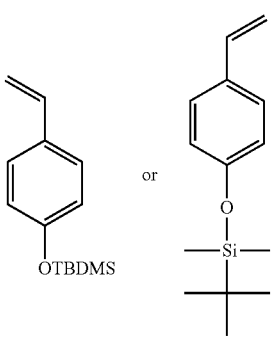 [SMILES: C=Cc1ccc(O[Si](C)(C)C(C)(C)C)cc1 ; C=Cc1ccc(O[Si](C)(C)C(C)(C)C)cc1]

and abbreviated TBDMSO-St and whose polymeric version is

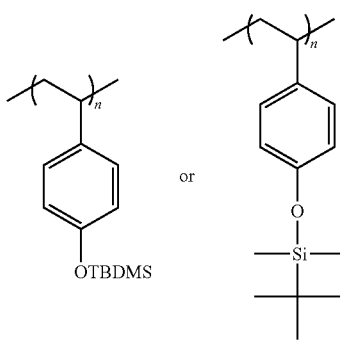

and is abbreviated P(TBDMSO-St).

Tert-butyldimethyl(oxiran-2-ylmethoxy)silane is an example of a silicon containing compound and is represented by the following structure:

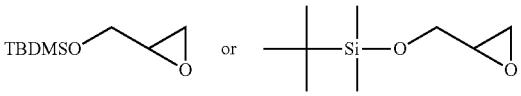

and is abbreviated TBDMSO-EO and whose polymeric version is

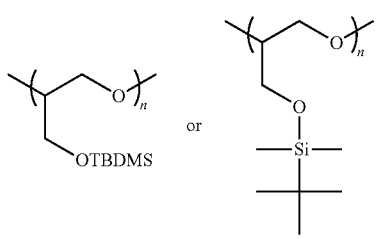

and is abbreviated P(TBDMSO-EO).

Methacryloxymethyltrimethylsilane is represented by the following structures:

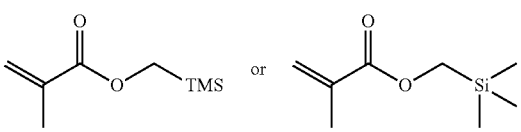

and abbreviated (MTMSMA) and whose polymeric version is

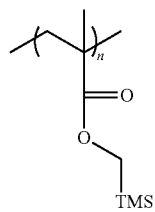

and is abbreviated P(MTMSMA).

In one embodiment,

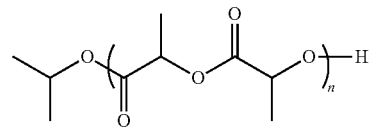

is an example of PLA homopolymer.

In one embodiment,

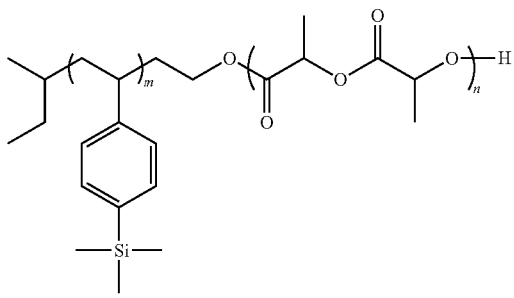

is an example of Poly(trimethylsilyl styrene-b-lactide) (PT-MSS-b-PLA).

The present invention also contemplates styrene "derivatives" where the basic styrene structure is modified, e.g. by adding substituents to the ring. Derivatives of any of the compounds shown in FIG. 1 can also be used. Derivatives can be, for example, hydroxy-derivatives or halo-derivatives. As used herein, "hydrogen" means —H; "hydroxy" means —OH; "oxo" means =O; "halo" means independently —F, —Cl, —Br or —I.

It is desired that the block copolymer be used to create "nanostructures" on a surface, or "physical features" with controlled orientation. These physical features have shapes and thicknesses. For example, various structures can be formed by components of a block copolymer, such as vertical lamellae, in-plane cylinders, and vertical cylinders, and may depend on film thickness, surface treatment, and the chemical properties of the blocks. In a preferred embodiment, said cylindrical structures being substantially vertically aligned with respect to the plane of the first film. Orientation of structures in regions or domains at the nanometer level (i.e. "microdomains" or "nanodomains") may be controlled to be approximately uniform, and the spatial arrangement of these structures may also be controlled. For example, in one embodiment, domain spacing of the nanostructures is approximately 50 nm or less. The methods described herein can generate structures with the desired size, shape, orientation, and periodicity. Thereafter, in one embodiment, these structures may be etched or otherwise further treated.

DETAILED DESCRIPTION OF THE INVENTION

A block copolymer (BC) is defined as two or more chemically distinct homopolymer chains covalently linked together [4]. A characteristic feature of BCs is that they can self-assemble into periodic structures such as lamellae, spheres, bicontinuous gyroids, and hexagonally packed cylinders with 5-100 nm domain sizes [11]. The morphology is dictated by the volume fraction of each block ($\phi$), overall degree of polymerization (N), and Flory-Huggins interaction parameter ($\chi$), all of which can be controlled synthetically [11].

For nanomanufacturing applications such as microelectronics, solar cells, and membranes, thin films with cylindrical or lamellar domains aligned perpendicular to a substrate surface are most attractive [12, 13]. BC thin film behavior has been studied by many researchers [14-16], and a recent review [12] has highlighted the importance of film thickness and interfacial interactions in dictating the BC orientation. One method of inducing cylinder or lamellar domains to orient perpendicular to the substrate is by treating the substrate with a surface modification agent such that the surface has an interfacial energy between that of each block. This type of substrate surface has been termed "neutral" because the enthalpic penalty for each block to establish contact with the substrate is approximately equal [14]. If this condition is not appropriately met, the cylinders or lamellae will usually lie parallel to the substrate with the block that most prefers the surface wetting the substrate [17].

The present invention includes a diblock copolymer system that self-assembles at very low molecular weights to form very small features. In one embodiment, one polymer in the block copolymer contains silicon, in this case polytrimethylsilylstyrene, and the other polymer is polylactide. In one embodiment, the block copolymer is synthesized by a combination of anionic and ring opening polymerization reactions. In one embodiment, these block copolymers can be used to form nanoporous materials that can be used as etch masks in lithographic patterning.

Block copolymers used in nanoscale lithographic patterning are typically composed of synthetic polymers only. While both polymers in the block copolymer in this invention are synthetic, the monomer used to make polylactide, lactide, is derived from naturally-occurring material, lactic acid. Also, with a few exceptions, polymers researched for lithographic patterning typically do not provide a metal-containing block and therefore have little etch selectivity. The polymer described in this invention has etch resistance due slow etching of the silicon-containing block and the fast etching of the polylactide block in an oxygen etch.

One potential solution to overcoming the feature-size limitations of conventional lithography techniques involves using self-assembled block copolymers to pattern nanoscale features. Block copolymer lithography circumvents physical and cost limitations present in conventional techniques. Polymers with high interaction parameters can form features much smaller than those achievable by photolithography and can do so using a less time-intensive process than electron beam lithography.

The present invention has advantages over current block copolymer systems currently used for lithographic patterning primarily because the invention allows formation of some of the smallest features achievable in known block copolymer systems. Small features correlate to higher feature density for greater storage in semiconductor applications. These small features are achieved since the polymers have high interaction parameters due to high chemical incompatibility between the blocks. The systems are also ideal for nanolithographic patterning due to good etch contrast between the blocks, which most polymers for this application do not have. When using an oxygen etching process, the polylactide block etches quickly while silicon-containing block etches slowly. Compared to polystyrene-block-polydimethylsiloxane, a block copolymer that does exhibit good etch contrast, both blocks have high glass transition temperatures, which enables them to be solid at room temperature.

There are various references that would be useful in understanding the current invention: Formation of a Device Using Block Copolymer Lithography (US patent application 20090305173/Dec. 10, 2009) [18]; "One-dimensional arrays of block copolymer cylinders and applications thereof" (U.S. Pat. No. 8,101,261/Jan. 24, 2012) [19]; Vayer, M. et al. (2010) Perpendicular orientation of cylindrical domains upon solvent annealing thin films of polystyrene-b-polylactide, Thin Solid Films 518(14), 3710-3715. [20]; Zalusky, A. S. et al. (2002) Ordered Nanoporous Polymers from Polystyrene-Polylactide Block Copolymers, J. Am. Chem. Soc. 124(43), 12761-12773. [21]; Wang, Y. and Hillmyer, M. A. (2000) Synthesis of Polybutadiene-Polylactide Diblock Copolymers Using Aluminum Alkoxide Macroinitiators. Kinetics and Mechanism, Macromolecules 33(20), 7395-7403. [22]; Jung, Y. S. and Ross, C. A. (2007) Orientation-Controlled Self-Assembled Nanolithography Using a Polystyrene-Polydimethylsiloxane Block Copolymer, Nano Lett. 7(7), 2046-2050.[23]; Ku, S. J. et al. (2011) Nanoporous hard etch masks using silicon-containing block copolymer thin films, Polymer 52(1), 86-90. [24].

It is desired that the silicon-containing copolymer be used to create "nanostructures" on a surface, or "physical features" with controlled orientation. These physical features have shapes and thicknesses. For example, various structures can be formed by components of a block copolymer, such as vertical lamellae, in-plane cylinders, and vertical cylinders, and may depend on film thickness, surface treatment, and the chemical properties of the blocks. In a preferred embodiment, said cylindrical structures being substantially vertically aligned with respect to the plane of the first film. Orientation of structures in regions or domains at the nanometer level (i.e. "microdomains" or "nanodomains") may be controlled to be approximately uniform, and the spatial arrangement of these structures may also be controlled. For example, in one embodiment, domain spacing of the nanostructures is approximately 50 nm or less. In another preferred embodiment, said nanostructures are spheres or spherical in shape. The methods described herein can generate structures with the desired size, shape, orientation, and periodicity. Thereafter, in one embodiment, these structures may be etched or otherwise further treated.

Advantages/Special Characteristics

The present invention provides advantages over current technologies. 1) Small block copolymer feature sizes attainable (High interaction parameter value); 2) Good etch contrast (polylactide etches quickly while silicon-containing block etches slowly in oxygen etch); 3) Simple synthesis process, 4) Both blocks have high glass transition temperatures (solid at room temperature); 5) Good solvent selectivity between blocks of copolymer; and 6) Polylactide material comes from a naturally-derived monomer It is desired that the block copolymer be used to create "nanostructures" on a surface, or "physical features" with controlled orientation. These physical features have shapes and thicknesses. For example, various structures can be formed by components of a block copolymer, such as vertical lamellae, in-plane cylinders, and vertical cylinders, and may depend on film thickness, surface treatment, and the chemical properties of the blocks. In a preferred embodiment, said cylindrical structures being substantially vertically aligned with respect to the plane of the first film. Orientation of structures in regions or domains at the nanometer level (i.e. "microdomains" or "nanodomains") may be controlled to be approximately uniform, and the spatial arrangement of these structures may also be controlled. For example, in one embodiment, domain spacing of the nanostructures is approximately 50 nm or less. In a preferred embodiment, said cylindrical structures are controlled by the deposition of a polymer topcoat and aligned in an annealing process. The methods described herein can generate structures with the desired size, shape, orientation, and periodicity. Thereafter, in one embodiment, these structures may be etched or otherwise further treated.

Applications

Polylactide/silicon-containing block copolymers have potential applications for overcoming feature-size limitations in nanoscale lithographic patterning. The compatibility of block copolymer patterning with current semiconductor processing makes nanoscale lithography with block copolymers a potentially viable solution to this problem.

Synthesis of PTMSS-b-PLA

Figure 2:
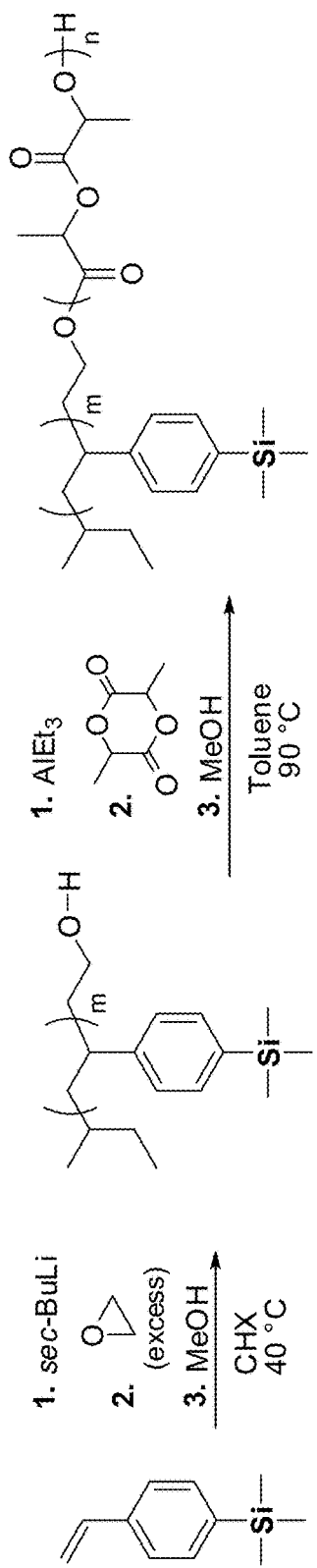
FIG. 2 shows the synthesis of PTMSS-b-PLA by a combination of anionic and ring-opening polymerization reactions.

PTMSS-b-PLA block copolymers were synthesized through a combination of anionic and ring-opening polymerization. PTMSSOH was synthesized by well-established methods for hydroxyl-functionalizing polystyrene and reacted with triethylaluminum to form an aluminum alkoxide macroinitiator, followed by the ring-opening of lactide. Poly(styrene-b-lactide) (PS-b-PLA) has been synthesized previously using this method. The reaction conditions used in this work were chosen based on previous kinetic studies performed on the ring-opening of lactide. The reaction mechanism for this polymer is shown in FIG. 2. Properties of the polymers synthesized in this study are reported in FIG. 10.

Figure 4:
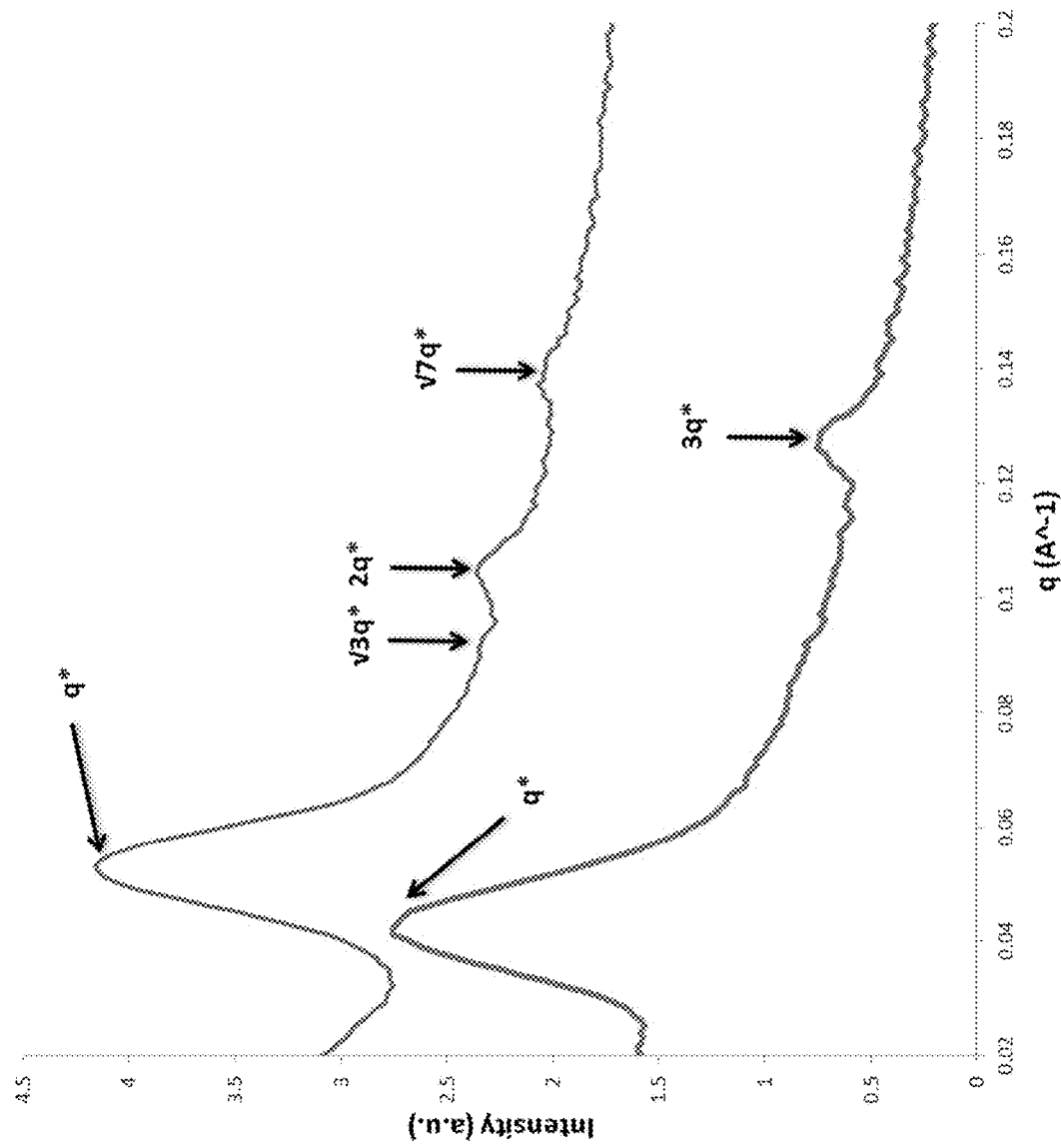
FIG. 4 shows the integrated SAXS curves of $PTMSS_6$-b-$PLA_{4.1}$ and $PTMSS_6$-b-$PLA_{7.1}$ where the arrows indicate the location of the primary and higher-order scattering peaks. Subscripted numbers indicate block molecular weight in kilograms/mole.

To determine the morphology and feature dimensions of the polymers synthesized in this work, small angle x-ray scattering (SAXS) experiments were performed on bulk samples. The morphologies of the polymers were determined by the proximities of the higher-order peaks to the primary peak (q*). Domain spacings were defined by the location of q* and were calculated as $d=2\pi/q^*$. SAXS profiles for the polymers investigated in this study are shown in FIG. 4.

Thin Film Orientation of PTMSS-b-PLA

Figure 5:
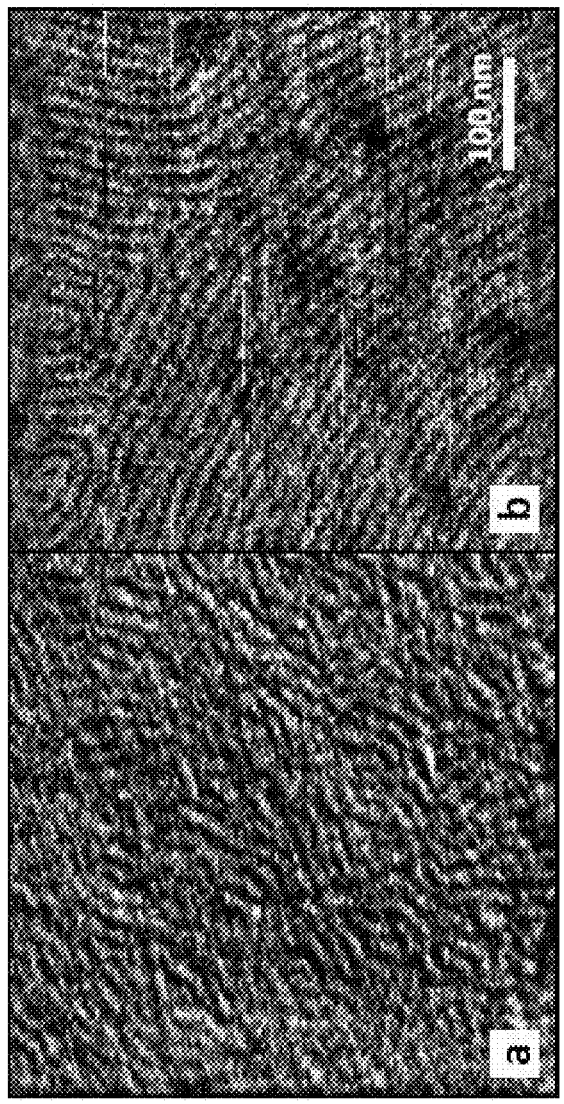
FIG. 5 shows the AFM phase images of a $PTMSS_6$-b-$PLA_{4.1}$ film a) as-cast and b) after thermally annealing the sample for two hours at 120° C.

To examine the thin film self-assembly behavior of the PTMSS-b-PLA block copolymers, polymer films were spin-coated onto silicon wafers with a native oxide layer. The as-cast polymer films are represented by the AFM phase image shown in FIG. 5a. After thermally annealing the sample for two hours at 120° C., a temperature above the glass transition temperatures of both blocks of the block copolymer, the cylindrical domains oriented parallel to the substrate as shown in FIG. 5b.

Figure 6:
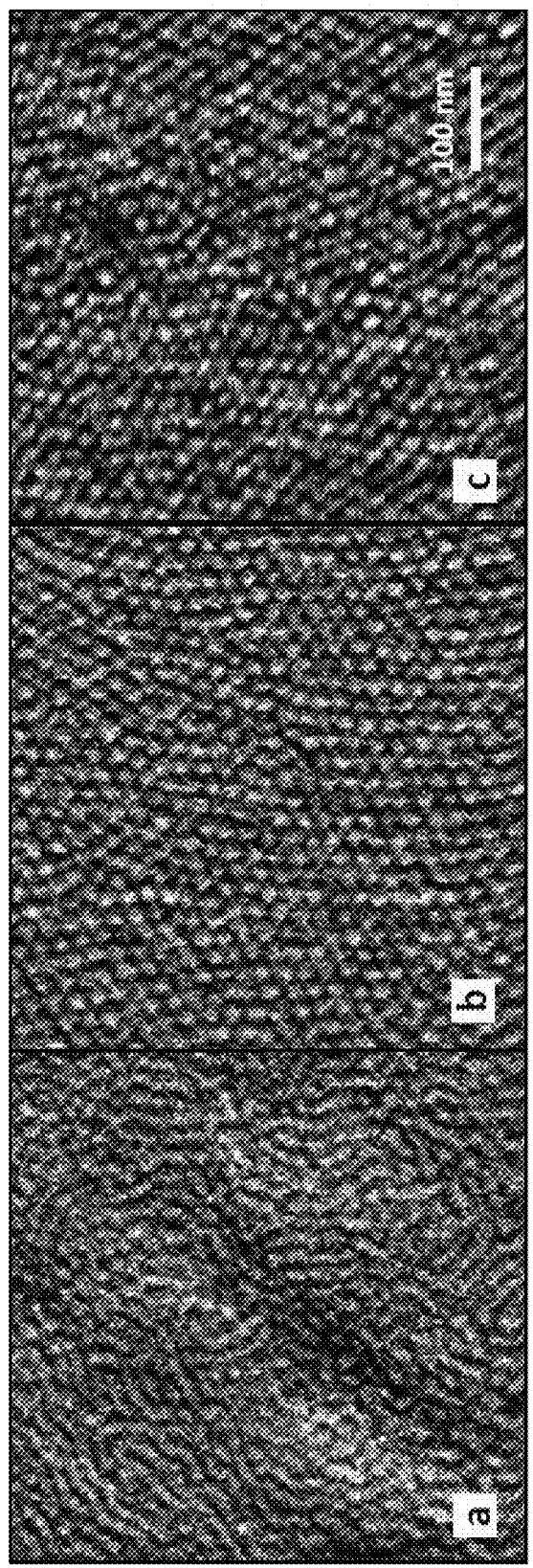
FIG. 6 shows the AFM phase images of a $PTMSS_6$-b-$PLA_{4.1}$ film after solvent annealing under cyclohexane vapor for a) 2 hours, b) 4 hours, and c) 23 hours.

Solvent annealing techniques were employed to achieve perpendicular orientation of the cylinder domains. Samples were solvent annealed under a cyclohexane vapor for various times. FIG. 6a shows parallel block copolymer orientation after a 2 hour anneal. FIG. 6b and FIG. 6c show perpendicular orientation after annealing the sample for 4 and 23 hours respectively.

Figure 7:
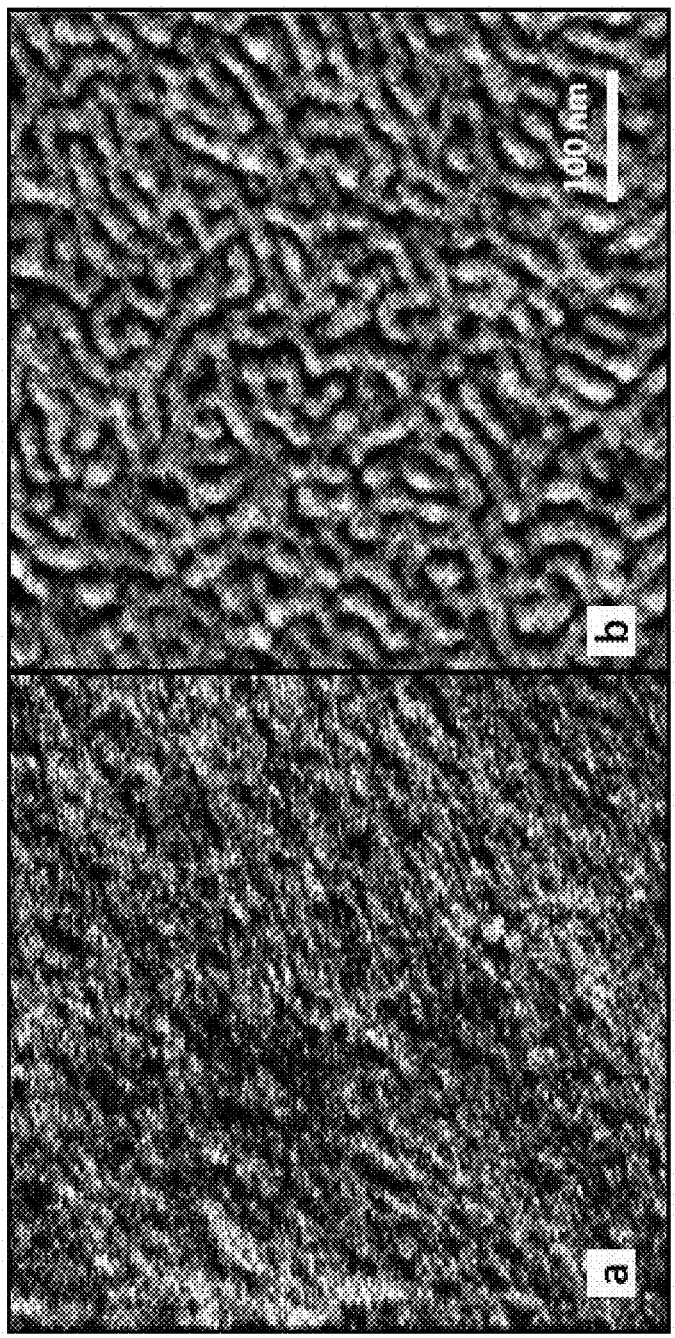
FIG. 7 shows the AFM phase images of $PTMSS_6$-b-$PLA_{7.1}$ a) as-cast and b) after solvent annealing under cyclohexane vapor for 4 hours.

Solvent annealing techniques were also employed to achieve perpendicular orientation of a lamellae-forming sample. FIG. 7a shows the lamellae-forming sample in a thin film as cast and FIG. 7b shows the same sample after solvent annealing under a cyclohexane vapor for 4 hours. The fingerprint pattern is representative of a lamellar sample aligned perpendicular to the substrate.

PLA Removal and Etch Contrast

Figure 8:
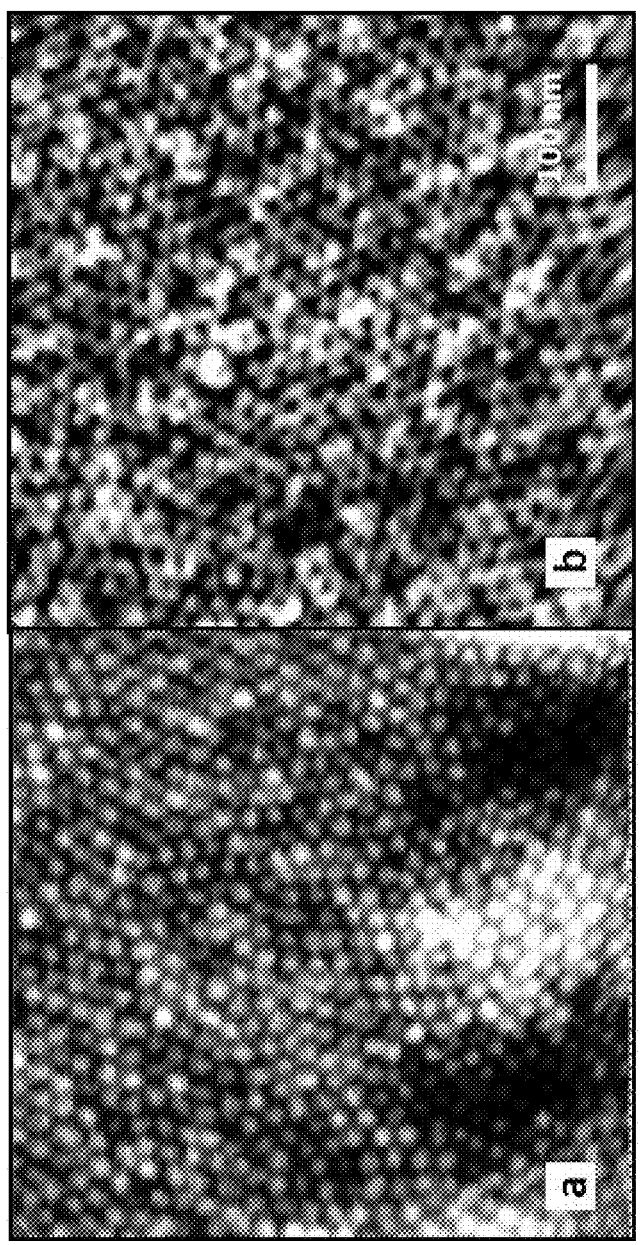
FIG. 8 shows the AFM height images of $PTMSS_6$-b-$PLA_{4.1}$ a) after solvent annealing under cyclohexane vapor for 4 hours and b) after etching the sample in a) with oxygen plasma.

After aligning the block copolymer films by solvent annealing, the etch characteristics of the material were investigated. An oxygen etch was used to remove the organic (PLA) domain while leaving the silicon-containing domain. FIG. 8 shows AFM height images of the cylinder-forming sample after solvent annealing but before etching and then after etching. In the image before etching, the circular PLA domains are brighter and thus protrude higher out of the sample. After etching, the PLA domains appear darker, meaning they are lower than the PTMSS domain. This indicates the removal of the PLA domain during etching.

Figure 9:
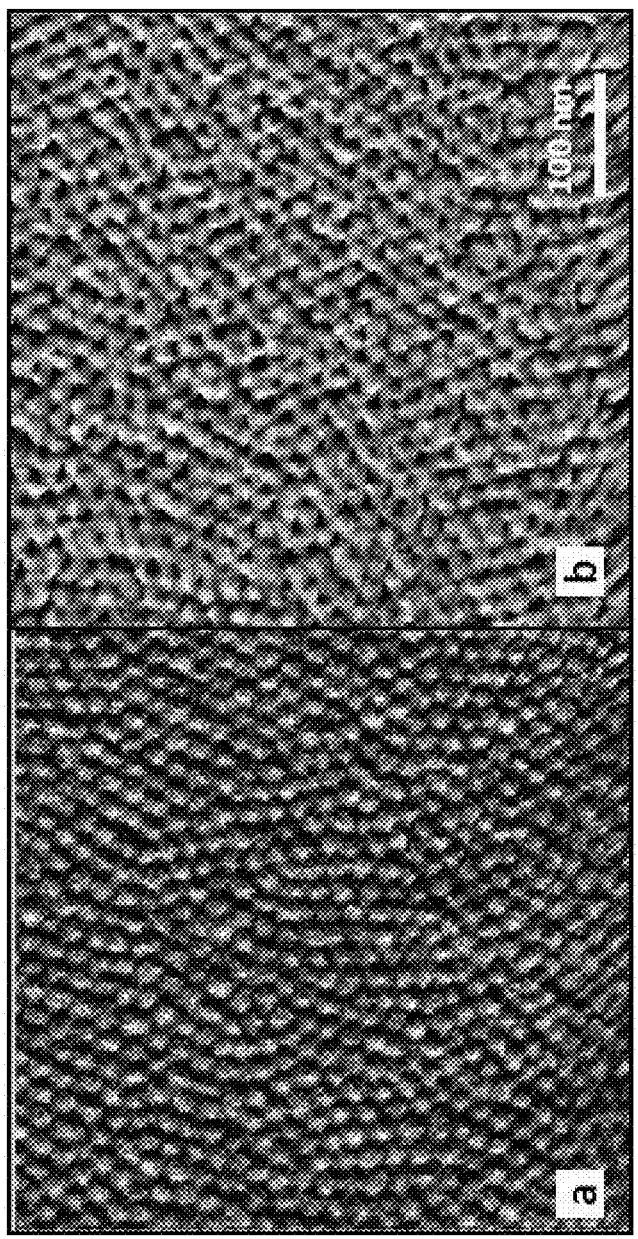
FIG. 9 shows the AFM phase images of $PTMSS_6$-b-$PLA_{4.1}$ a) after solvent annealing under cyclohexane vapor for 4 hours and b) after etching the sample in a) with oxygen plasma.

The AFM phase images of the cylinder-forming PTMSS-b-PLA undergo a similar transformation as the height images after etching. The phase image is representative of the modulus of the block copolymer domains and undergoes a similar inversion after etching as shown in FIG. 9.

Cross-linking the block copolymer before etching increase the material strength to ensure the self-assembled nanostructures are retained in their shape after etching. Removal of material during the etching process can damage nanostructures if they are not mechanically robust. Cross-linking in the block copolymer can make the nano structures more mechanically robust. Incorporating crosslinking functional groups within the polymer structure is only useful when one of the domains of the block copolymer has high resistance against dry etching. This is fairly easy to achieve by incorporation of more than 10% by weight of the element silicon into one of the blocks. In one embodiment such Silicon-Containing Block Co-Polymers are described in a patent applications entitled "Silicon-Containing Block Co-Polymers, Methods for Synthesis and Use" U.S. 61/315,235/ Mar. 18, 2010 [25] and PCT/US11/28867, filed Mar. 17, 2011 [26], herein incorporated by reference. Other elements that form refractory oxides can function in a similar fashion. It is not intended that the present invention be limited to a specific silicon-containing monomer or copolymer. Illustrative monomers are shown in FIG. 1.

Thus, specific compositions and methods of Polylactide/Silicon-containing Block Copolymers for Nanolithography have been disclosed. It should be apparent, however, to those skilled in the art that many more modifications besides those already described are possible without departing from the inventive concepts herein. The inventive subject matter, therefore, is not to be restricted except in the spirit of the disclosure. Moreover, in interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

All publications mentioned herein are incorporated herein by reference to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates, which may need to be independently confirmed.

EXPERIMENTAL

Materials

All reagents were used as received unless otherwise noted. Cyclohexane was purified by passing through an activated alumina column and through a supported copper catalyst. Trimethylsilyl styrene (TMSS) was synthesized as previously reported and distilled twice over dibutylmagnesium. Ethylene oxide was distilled twice over butylmagnesium chloride. D,L lactide (Alfa Aesar) was purified by recrystallization from ethyl acetate, dried in vacuo, and stored in a drybox. Toluene and isopropanol were distilled once over calcium hydride and stored in a drybox. Cyclohexane for solvent annealing was used as received.

Example 1

Synthesis of Hydroxyl-Terminated Poly(Trimethylsilyl Styrene) (PTMSSOH)

PTMSSOH was synthesized by anionic polymerization via standard Schlenk techniques under Ar atmosphere as previously reported. An appropriate amount of sec-butyllithium was added dropwise to purified cyclohexane under Ar atmosphere and stirred at 40° C. for ten minutes. Several drops of TMSS were added to seed the polymerization and were allowed to react for fifteen minutes. After this time, the remaining TMSS was added dropwise. The solution reacted overnight. The polymer was endcapped with a hydroxyl functionality by adding purified ethylene oxide and allowing to react overnight. Degassed methanol was added after this time to quench the living anions. The polymer was precipitated in methanol and dried in vacuo.

Example 2

Synthesis of Poly(Trimethylsilyl Styrene-b-Lactide) (PTMSS-b-PLA)

Lactide polymerizations were performed in a drybox using dry toluene. One mole of triethylaluminum (AlEt3) solution (1.1 M) was added dropwise to PTMSSOH in toluene per one mole of PTMSSOH to form an aluminum alkoxide macroinitiator. After stirring this solution for 2 hours, D,L lactide was added, the flask was capped, brought out of the drybox, submerged in a 90° C. oil bath, and stirred for 6 hours. After this time, the reaction was quenched with 1 mL 1N HCL and precipitated in a 50:50 methanol:water mixture. The polymer was filtered and dried under vacuum. The PDI of the block copolymer was determined by GPC and the molecular weight of the PLA block was determined by $^1$H NMR. The reaction is shown schematically in FIG. 2.

Example 3

Synthesis of Polylactide (PLA) Homopolymer

Figure 3:
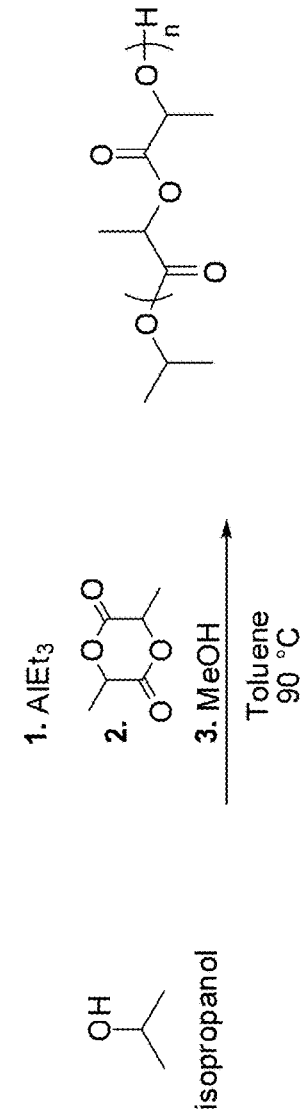
FIG. 3 shows the synthesis of polylactide (PLA) homopolymer.

PLA homopolymer was synthesized using the same procedure as PTMSS-b-PLA, however dry isopropanol was used as the initiator instead of PTMSSOH macroinitiator, as shown in FIG. 3.

REFERENCES

1. Ross, C. A. (2001) Patterned Magnetic Recording Media, *Annu. Rev. Mater Res.* 31(1), 203-238.
2. Yang, X. et al. (2008) Toward 1 Tdot/in.$^2$ nanoimprint lithography for magnetic bit-patterned media: Opportunities and challenges *J. Vac. Sci. Technol.* 26(6), 2604-2610
3. Ruiz, R. et al. (2008) Density Multiplication and Improved Lithography by Directed Block Copolymer Assembly, *Science* 321(5891), 936-939.
4. Bates, F. S. and Fredrickson, G. H. (1990) Block Copolymer Thermodynamics: Theory and Experiment, *Annu. Rev. Phys. Chem.* 41, 525-557.
5. Li, M. and Ober, C. K. (2006) Block copolymer patterns and templates, *Mater. Today* 9(9), 30-39.

6. Colburn, M. et al. (2000) Step and flash imprint lithography for sub-100-nm patterning, *Proc. SPIE-Int. Soc. Opt. Eng.* 3997, 453-457.
7. Kim, H.-C. et al. (2001) A Route to Nanoscopic SiO$_2$ Posts via Block Copolymer Templates, *Adv. Mater.* 13(11), 795-797.
8. Nagarajan, S. et al. (2008) An Efficient Route to Mesoporous Silica Films with Perpendicular Nanochannels, *Adv. Mater* 20(2), 246-251.
9. Lammertink, R. G. H. et al. (2000) Nanostructured Thin Films of Organic-Organometallic Block Copolymers: One-Step Lithography with Poly(ferrocenylsilanes) by Reactive Ion Etching, *Adv. Mater* 12(2), 98-103.
10. Gillham, J. K. (1986) Formation and Properties of Thermosetting and High T$_g$ Polymeric Materials, *Polym. Eng. Sci.* 26(20), 1429-1433.
11. Bates, F. S. and Fredrickson, G. H. (1999) Block Copolymers-Designer Soft Materials, *Phys. Today* 52(2), 32-38.
12. Kim, H.-C., Park, S.-M., and Hinsberg, W. D. (2009) Block Copolymer Based Nanostructures: Materials, Processes, and Applications to Electronics, *Chemical Reviews* 110(1), 146-177.
13. Park, M. et al. (1997) Block Copolymer Lithography: Periodic Arrays of ~1011 Holes in 1 Square Centimeter, *Science* 276(5317), 1401-1404.
14. Elan, E. et al. (2009) Perpendicular Orientation of Domains in Cylinder-Forming Block Copolymer Thick Films by Controlled Interfacial Interactions, *Macromolecules* 42(13), 4896-4901.
15. Ryu, D. Y. et al. (2007) Surface Modification with Cross-Linked Random Copolymers: Minimum Effective Thickness, *Macromolecules* 40(12), 4296-4300.
16. Walton, D. G. et al. (1994) A Free Energy Model for Confined Diblock Copolymers, *Macromolecules* 27(21), 6225-6228.
17. Bates, C. M. et al. (2011) Polymeric Cross-Linked Surface Treatments for Controlling Block Copolymer Orientation in Thin Films, *Langmuir* 27(5), 2000-2006.
18. Xiao, S. and Yang, X. "Formation of a Device Using Block Copolymer Lithography," United States patent application 20090305173 application Ser. No. 12/135,387, filed Jun. 9, 2008. (Published Dec. 10, 2009).
19. Millward, D. B. and Stuen, K. "One-dimensional arrays of block copolymer cylinders and applications thereof," U.S. Pat. No. 8,101,261 application Ser. No. 12/030,562, filed Feb. 13, 2008. (Published Jan. 24, 2012).
20. Vayer, M. et al. (2010) Perpendicular orientation of cylindrical domains upon solvent annealing thin films of polystyrene-b-polylactide, *Thin Solid Films* 518(14), 3710-3715.
21. Zalusky, A. S. et al. (2002) Ordered Nanoporous Polymers from Polystyrene-Polylactide Block Copolymers, *J. Am. Chem. Soc.* 124(43), 12761-12773.
22. Wang, Y. and Hillmyer, M. A. (2000) Synthesis of Polybutadiene-Polylactide Diblock Copolymers Using Aluminum Alkoxide Macroinitiators. Kinetics and Mechanism, *Macromolecules* 33(20), 7395-7403.
23. Jung, Y. S. and Ross, C. A. (2007) Orientation-Controlled Self-Assembled Nanolithography Using a Polystyrene-Polydimethylsiloxane Block Copolymer, *Nano Lett.* 7(7), 2046-2050.
24. Ku, S. J. et al. (2011) Nanoporous hard etch masks using silicon-containing block copolymer thin films, *Polymer* 52(1), 86-90.
25. Willson, C. G. et al. "Silicon-Containing Block Co-Polymers, Methods for Synthesis and Use," U.S. Patent Application 61/315,235, filed Mar. 18, 2010.
26. Willson, C. G. et al. "Silicon-Containing Block Co-Polymers, Methods for Synthesis and Use," United states patent application PCT/US11/28867, filed Mar. 17, 2011.

The invention claimed is:

1. A method of synthesizing a silicon and lactide-containing block copolymer, comprising:
   a) providing first and second monomers, said first monomer comprising a silicon atom and said second monomer being a lactide based monomer lacking silicon;
   b) treating said second monomer under conditions such that reactive polymer of said second monomer is formed; and
   c) reacting said first monomer with said reactive polymer of said second monomer under conditions such that said silicon-containing block copolymer is synthesized, wherein the glass transitions of both blocks are above room temperature, wherein one of the blocks is polytrimethylsilylstyrene.

2. The method of claim 1, wherein at least one of said blocks is cross-linkable.

3. The method of claim 1, wherein a third monomer is provided and said block copolymer is a triblock copolymer.

4. The method of claim 1, wherein said block copolymers form nanostructured materials that can be used as etch masks in lithographic patterning processes.

5. The method of claim 1, wherein the method further comprises the step d) coating a substrate with said block copolymer so as to create a block copolymer film.

6. The method of claim 5, wherein said substrate comprises silicon.

7. The method of claim 5, wherein said substrate is a silicon wafer.

8. The method of claim 5, wherein said substrate is quartz.

9. The method of claim 5, wherein said substrate is glass.

10. The method of claim 5, wherein said substrate is plastic.

11. The method of claim 10, wherein said plastic is polyethylene terephthalate.

12. The method of claim 10, wherein said plastic is polytetrafluoroethylene.

13. The method of claim 5, wherein said substrate is a transparent substrate.

14. The method of claim 5, wherein said substrate is coated with a substrate surface energy neutralizing layer with surface energy in between that of two blocks.

15. The method of claim 14, wherein said substrate surface energy neutralizing layer is selected from the group consisting of: (a) high Tg polymer, (b) a cross-linked polymer, (c) vapor deposited polymer such as parylene, (d) small molecule derivatives of silylating agents, and (e) polymer brush by end-attaching polymer to substrate.

16. A method of synthesizing a silicon and lactide-containing block copolymer, comprising:
   a) providing first and second monomers, said first monomer comprising a silicon atom and said second monomer being a lactide based monomer lacking silicon;
   b) treating said second monomer under conditions such that reactive polymer of said second monomer is formed; and
   c) reacting said first monomer with said reactive polymer of said second monomer under conditions such that said silicon-containing block copolymer is synthesized, wherein the glass transitions of both blocks are above room temperature, wherein said block copolymer is endcapped.

17. The method of claim 16, wherein said block copolymer is endcapped with a functional group.

18. The method of claim 16, wherein said block copolymer is endcapped with a hydroxyl functionality by reacting with ethylene oxide.

19. A method of synthesizing a silicon and lactide-containing block copolymer, comprising:
   a) providing first and second monomers, said first monomer comprising a silicon atom and said second monomer being a lactide based monomer lacking silicon;
   b) treating said second monomer under conditions such that reactive polymer of said second monomer is formed; and
   c) reacting said first monomer with said reactive polymer of said second monomer under conditions such that said silicon-containing block copolymer is synthesized, wherein the glass transitions of both blocks are above room temperature, wherein the method further comprises precipitating said silicon-containing block copolymer in methanol.

20. A method of synthesizing a silicon and lactide-containing block copolymer, comprising:
   a) providing first and second monomers, said first monomer comprising a silicon atom and said second monomer being a lactide based monomer lacking silicon;
   b) treating said second monomer under conditions such that reactive polymer of said second monomer is formed; and
   c) reacting said first monomer with said reactive polymer of said second monomer under conditions such that said silicon-containing block copolymer is synthesized, wherein the glass transitions of both blocks are above room temperature, wherein said first monomer is trimethylsilylstyrene.

21. A method of synthesizing a silicon and lactide-containing block copolymer, comprising:
   a) providing first and second monomers, said first monomer comprising a silicon atom and said second monomer being a lactide based monomer lacking silicon;
   b) treating said second monomer under conditions such that reactive polymer of said second monomer is formed; and
   c) reacting said first monomer with said reactive polymer of said second monomer under conditions such that said silicon-containing block copolymer is synthesized, wherein the glass transitions of both blocks are above room temperature, wherein said first monomer is a silicon-containing methacrylate.

22. The method of claim 21, wherein said first monomer is methacryloxymethyltrimethylsilane (MTMSMA).

* * * * *